United States Patent [19]

Berkovich et al.

[11] Patent Number: 4,598,411
[45] Date of Patent: Jul. 1, 1986

[54] ON-THE-FLY DATA COMPRESSION SYSTEM

[75] Inventors: Semyon Berkovich, Rockville, Md.; Colleen R. Wilson, Campbellville, Canada; Chris J. Walter, Columbia, Md.

[73] Assignee: Allied Corporation, Morristown, N.J.

[21] Appl. No.: 631,660

[22] Filed: Jul. 17, 1984

[51] Int. Cl.⁴ .................. H04B 14/06; H03M 7/50
[52] U.S. Cl. ........................ 375/27; 375/122; 358/136; 358/260; 370/118
[58] Field of Search .............. 358/133, 136, 260; 375/27, 122; 455/72; 370/118; 381/29, 31

[56] References Cited

U.S. PATENT DOCUMENTS

| | | | |
|---|---|---|---|
| 3,801,737 | 4/1974 | Komura et al. | 358/135 |
| 3,895,184 | 7/1975 | Komura et al. | 358/260 |
| 3,987,412 | 10/1976 | Morrin | 382/56 |
| 4,006,297 | 2/1977 | Koga | 358/136 |
| 4,087,788 | 5/1978 | Johannesson | 382/55 |
| 4,270,148 | 5/1981 | Adachi | 358/260 |
| 4,288,816 | 8/1981 | Kashioka et al. | 358/138 |
| 4,355,306 | 10/1982 | Mitchell | 358/260 |
| 4,493,074 | 1/1985 | Walter et al. | 370/119 |

OTHER PUBLICATIONS

"Transmitting Television as Clusters of Frame-to-Frame Differences", Candy et al., BSTJ, vol. 60, No. 6, Jul.-Aug. 1971.

Berkovich & Wilson, "A Computer Communication Technique Using Content Induced Transaction Overlap", ACM Transactions on Computer Systems, vol. 2, No. 1, Feb. 1984.

Primary Examiner—Robert L. Griffin
Assistant Examiner—Raymond C. Glenny
Attorney, Agent, or Firm—J. R. Ignatowski

[57] ABSTRACT

An on-the-fly data compression system for compressing the data transmitted between a data source and an ultimate utilization device. The system normally has two data compression modules implementing a conventional multi-buffering scheme and a decoder for reconstructing the compressed data to its original format. The data compression modules compresses the data using a word representation by associative processing buffer and a content induced transaction overlap transmission protocol which results in an interleaved transmission of data bits and bit position bits, the latter being indicative of the number of data bits that will be transmitted during the subsequent data transmission. The decoder reconstructs the compressed data to its original format in response to the transmitted data and bit position bits and stores them in a pair of buffers in the sequential order in which they were generated.

20 Claims, 12 Drawing Figures

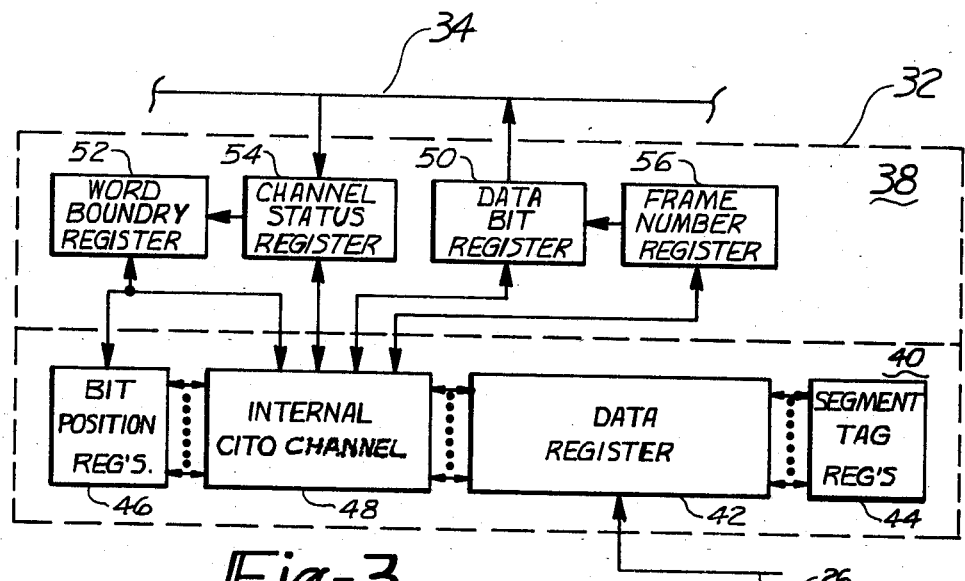
Fig-3
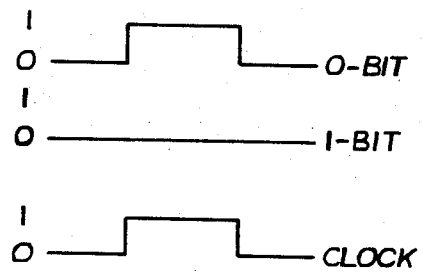
Fig-4
Fig-6
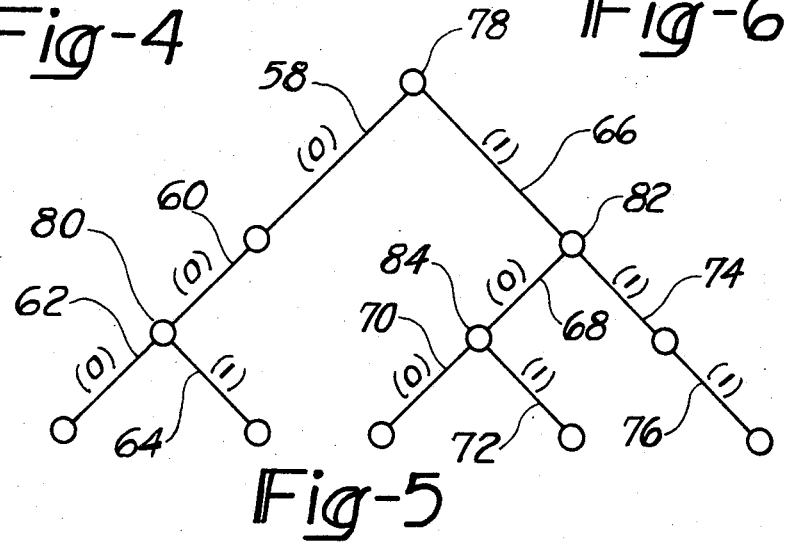
Fig-5

ON-THE-FLY DATA COMPRESSION SYSTEM

BACKGROUND OF THE INVENTION

1. Field of the Invention

The invention is related to the field of data compression and in particular to an on-the-fly data compression system using a word representation by associative processing buffer and content induced transaction overlap transmission protocol.

2. Prior Art

In the transmission of image information, such as the output of a television camera or similar device, data compression is a useful tool since it reduces the channel bandwidth required to transmit the data. It also finds use in the storage of large quantities of data, since it reduces the storage requirements for a given amount of data.

Various methods for data compression are known in the art. Komura et al in U.S. Pat. No. 3,801,737 describes a video signal compression and expansion system in which the binary coded video signals of one scanning line are compared, bit by bit, to the signals of the preceding line. The compression coding is accomplished with respect to a reference binary coded video signal. In an alternate system, Komura et al in U.S. Pat. No. 3,895,184 teaches a facsimile system with buffered transmission and reception in which the coded and compressed signals are temporarily stored within a storage device through a buffered memory. When the quantity of data stored in the buffer memory is in excess of a predetermined level, the video signals of the next scanning line are regarded as being completely identical with those of the preceding scanning line. Morrin II, in U.S. Pat. No. 3,987,412 describes a data compression system using a boundary follower. This system contemplates raster scanning an image until a first black picture element is ascertained. The outer border of this image is encoded by a border follower which drives a cursor. The border follower records each black picture element as is is encountered as a series of discrete differential azimuths in a chain link code form. Johannesson in U.S. Pat. No. 4,087,788 describes a system in which data compression is achieved through analyzing the images and utilizing special encoding for geometrical shapes. Adachi, in U.S. Pat. No. 4,270,148, discloses a system based on the run length encoding technique for data compression while Kashioha et al, in U.S. Pat. No. 4,288,816, teaches repeatedly scanning the same image at different sampling points. Finally, Mitchell, in U.S. Pat. No. 4,355,306, teaches a system which encodes images by assigning variable length code words to fixed positions in a dynamic stack, utilizing vertical reference and run length encoding.

The on-the-fly data compression system described herein is an alternate method for data compression using a word representation by associative processing buffer and a content induced transaction overlap transmission protocol similar to that disclosed in commonly assigned U.S. Pat. No. 4,493,074 entitled "Content Induced Transaction Overlap Communication System," issued Jan. 8, 1985.

SUMMARY OF THE INVENTION

The invention is an on-the-fly data compression system for compressing the data transmitted between a data source and an ultimate utilization device. The data compression system comprises at least one data compression module for transmitting the data received from the data source on a data communication channel in a compressed format comprising an interleaved transmission of data bits and bit position bits indicative of the number of data bits which are different from the preceding data bit transmission and a decoder responsive to the data and bit position bits transmitted on the communication channel for reconstructing the data to its original format as generated by the data source.

Each data compression module comprises a plurality of sub-modules, each sub-module having data storage means for temporarily storing predetermined segments of the data received from the data source in a plurality a discrete data registers, means for repeatedly selecting from data registers, data bits to be transmitted; means for transmitting said selected data bits on the communication channel, one at a time, simultaneously with the data bits selected by the other sub-modules using a content induced transaction overlap protocol until all of the data in sub-module is transmitted, and bit competition means, responsive to each time all the data bits from any data register in any sub-module are completely transmitted for transmitting said bit position bits on said communication channel simultaneously with the other sub-modules, to identify each data register from which subsequent data bits are to be selected. The transmitted bit position bits are indicative of the number of data bits remaining in the data registers having the smallest number of bits remaining to be transmitted.

The advantage of the invention is that the data is compressed as it is being transmitted, significantly reducing bandwidth required for the transmission of compressed data. This and other advantages of the on-the-fly data compression system will become more apparent from a reading of the specification in conjunction with the attached drawings.

BRIEF DESCRIPTION OF THE DRAWINGS

FIG. 3 is a block diagram of the CITO-WRAP Sub-Module.

FIG. 4 is a table of five 3-bit words

FIG. 5 is a binary tree representation of the five 3-bit words shown on FIG. 4.

FIG. 6 shows the waveforms of the transmitted bits.

DETAILED DESCRIPTION OF THE INVENTION

The on-the-fly data compression system is for reducing the amount of data that is transmitted between a data source and a utilization device and is particularly applicable to the transmission of digitized picture rasters for CRT displays.

Figure 1:
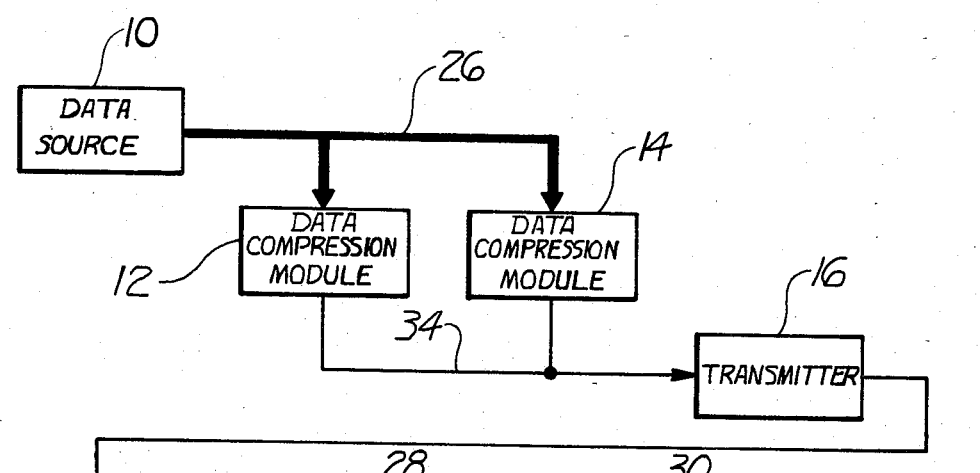
FIG. 1 is a block diagram of the Data Compression system.
Figure 1:
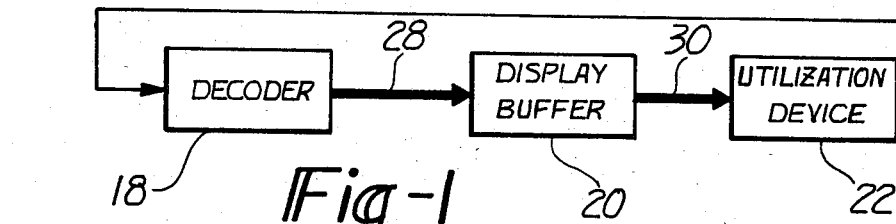

FIG. 1 is a block diagram of the on-the-fly data compression system. Referring to FIG. 1, digitized data from a Data Source 10 is received by at least a pair of Data Compression Modules 12 and 14 where the digitized data is buffered in a Word Representation by Associative Processing (WRAP) buffer and compressed using a Content Induced Transaction Overlap (CITO) protocol such as disclosed in U.S. Pat. No. 4,493,074. The two Data Compression Modules 12 and 14 implement a conventional multi-buffering scheme such that when data is being received by one of the Data Compression Modules, the other Data Compression Module is serially transmitting the compressed data by means of a Transmitter 16 to a Decoder 18 over a Communication Link 24. The Communication Link 24 may be a hard wired link or a radio communication link as is known in the art. In those systems where transmission distances may be relatively short, the transmitter 16 may be omitted and the transmission will be directly between the Data Compression Modules 12, 14 and the Decoder 18.

The Decoder 18 reconstructs (decodes) the received compressed data from its compressed format to its original format and temporarily stores the reconstructed data in Display Buffer 20. The reconstructed data in Display Buffer 20 is subsequently transmitted to a Utilization Device 22 which is the ultimate receiver in the system. Display Buffer 20 comprises a pair of individual buffers alternately storing the data from the two Data Compression Modules 12 and 14. Thus, when one of the individual buffers is being loaded with the decoded data, the other is transmitting data to the Utilization Device 22 and vice versa.

The decompressed data links are illustrated by the darker (heavier) communication links such as Data Link 26 between the Data Source 10 and the Data Compression Modules 12 and 14, Data Link 28 between the Decoder 18 and Display Buffer 20 and the Data Link 30 between the Display Buffer 20 and the Utilization Device 22. In the preferred embodiment, the Data Source 10 may be a television camera or a storage element outputting digitized picture information and the Utilization Device 22 may be a television receiver, a similar type of visual display device or another storage element.

Figure 2:
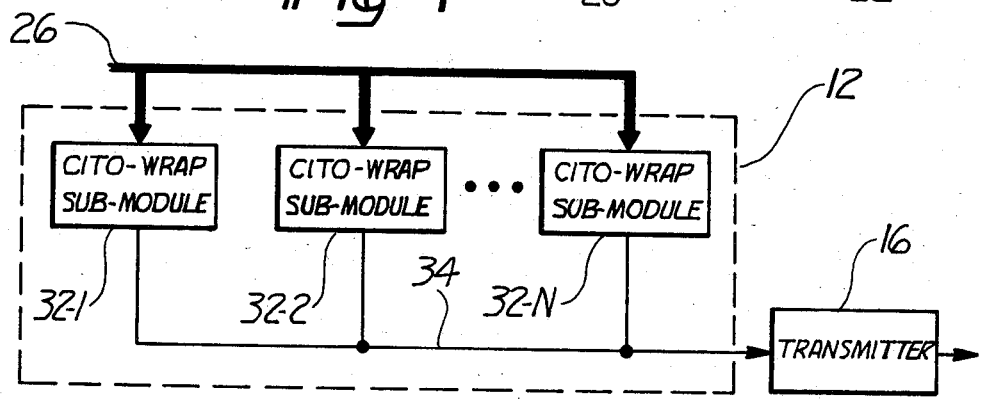
FIG. 2 is a block diagram of a Data Compression Module.

Referring to FIG. 2, Data Compression Modules 12 or 14 each consist of a set of "N" Content Induced Transaction Overlap (CITO) interfaces and Word Representation by Associative Processing (WRAP) buffers identified as CITO-WRAP Sub-Modules 32-1, 32-2, through 32-N. Each of the CITO-WRAP Sub-Modules 32 is connected to the Data Link 26 and in the preferred embodiment stores a single frame of data received from the Data Source 10. The plurality of CITO-WRAP Devices 32-1 through 32-N collectively store the sequential frames of data as they are generated. The collection of data frames in the plurality of CITO-WRAP Sub-Modules 32 in each Data Compression Module 12 or 14 is called a "data bucket". The output of each CITO-WRAP Sub-Module 32 may be connected to a common Transmitter 16 by means of an External CITO Channel 34 which acts as a transmission buffer or connected directly to the Decoder 18. After all of the CITO-WRAP Sub-Modules 32 in a given Data Compression Module are filled with a frame of data, the stored data is transmitted using the content induced transaction overlap protocol disclosed in U.S. Pat. No. 4,493,074 which is incorporated herein by reference.

Briefly, each of the CITO-WRAP Sub-Modules 32-1 through 32-N begin to simultaneously transmit their stored data using a preorder binary tree traversal which locally compresses spatial frame data similarities within each CITO-WRAP Sub-Module 32 and globally compress temperal frame data similarities among the plurality of CITO-WRAP Sub-Modules 32 in the given Data Compression Module.

The structural details of each CITO-WRAP Sub-Module 32 are shown in FIG. 3. Each CITO-WRAP Sub-Module 32 is partitioned into two functional units, the CITO Interface 38 and the WRAP buffer 40. The data is segmented, at the acquisition time, by the WRAP Buffer 40 into a plurality of individual data registers collectively identified as Data Register 42. Each data segment represents a subdivision of the data, for example a raster line of a TV picture or part thereof. As the bits are acquired, they are shifted into a predetermined data register of Data Register 42. When that data register is filled, the next data segment is shifted into the next data register, etc. When all the registers of the Data Register 42 are filled, the incoming data is transferred to next CITO-WRAP Sub-Module where it is loaded into a corresponding Data Register 42. This process continues until all of the Data Registers 42 in all of the CITO-WRAP Sub-Modules 32 are filled. After all of Data Registers 42 in a given Data Compression Module 12 or 14 are filled, the data is uninterruptedly redirected to fill the Data Registers 42 of the CITO-WRAP Sub-Modules 32 in the other Data Compression Module. In this manner, each CITO-WRAP Sub-Module 32 will contain temporarily sequenced data.

The WRAP Buffer 40 also includes a Segment Tag Register 44, bit Position Registers 46 and an Internal CITO Channel 48. The Segment Tag Register 44 stores a plurality of segment or line tags which are appended to the data stored in each data register in the Data Register 42. The Bit Position Registers 46 comprise a plurality of bit position registers, one associated with each data register comprising Data Register 42. Each bit position register stores a number indicative of the number of data bits in its associated data register remaining to be transmitted. Each bit position register is initially loaded with a number of indicative of the number of bits initially stored in the associated register and includes the number of bits in the line tag and frame number. The Internal CITO Channel 48 is the primary communications link between the WRAP Buffer 40 and the CITO Interface 38 and is functionally equivalent to the CITO Interface 38 described in detail hereinafter.

The CITO Interface 38 comprises a Data Bit (DB) Register 50, A Word Boundary (WB) Register 52, a Channel Status (CS) Register 54, and a Frame Number Register 56 which stores a specific identification code (frame number) for each of the CITO-WRAP Sub-Modules. This identification code or frame number is transmitted after each data segment and line tag is sent. The Data Bit Register 50 is a single bit register storing the data bit to be transmitted on External CITO Channel 34. This data bit is selected from at least one data register in the Data Register 42 under the control of the Internal CITO Channel 48. The Channel Status Register 54 is a one bit register storing the bit value of the current transmission on the External CITO Channel 34 and functions as the listening post for the CITO-WRAP Sub-Module 32. The Word Boundary Register 52 keeps track of the number of bits that have been transmitted over the External CITO Channel 34 and is used to determine when the transmission of a data segment stored in one of the data registers, the line tag and frame number have been completely transmitted.

The CITO protocol is based on multiple match resolution methods developed for associative (content-addressable) memory technology developed by G.G. Stetsyura described in his article "A New Principle of Organization of Computer Memories" Doklandy Akademiija Nauk USSR Vol 132, No. 6, pp. 1291-1294 and by M. H. Lewin described in his article "Retrieval of Ordered Lists from a Content-Addressed Memory" RCA Review June 1962, pp. 215-229. Using an analogy, a multiple access organization called "Decentralized Priority Access" was suggested and developed by G. A. Kotyuzkanski et al, "Decentralized Priority Control in a Single Channel Data Transmission System" Technickeskaya Kibernetika No. 2, 1971 and by L. B. Nisnevich and G. G. Stetsyura, "Decentralized Priority Control in Integral Communication Systems" Automation and Remote Control Vol 33, No. 4, pp. 795-798, 1972 and by T. N. Zakharova et al "Fast Algorithm for Decentralized Priority Access to a Common Channel" Automation and Remote Control Vol. 41, No. 2, part 2, Oct 1980, pp. 1463-1469. In these publications, this algorithm was used for decentralized control to resolve contention for channel acces among senders of various priorities.

The CITO protocol as disclosed by S. Y. Berkovich and C. R. Wilson in their article "A Computer Communication Technique Using Content-Induced Transaction Overlap" ACM Transactions on Computer Systems, Vol. 2, No. 1, February 1984, pages 60-77, uses this algorithm in a different way. Instead of resolving channel access priority, the algorithm is applied to the transmission of the data. In the CITO protocol, the collection of data segments is transmitted concurrently by the individual CITO-WRAP Sub-Modules 32. The data content of the individual data segments are resolved gradually from the overlapping transmissions. The transmission is in fact a decentralized preorder traversal of the binary tree representation of the data segments which results in the desired data compression.

To understand the application of the algorithm, consider the five 3-bit words listed in the table shown in FIG. 4. In a normal sequential transmission, 15 bits are required to represent these five words in some sequence. Now consider the binary tree representation of these same five words illustrated in FIG. 5. The binary tree has 10 branches 58 through 76 which are labeled 0's and 1's so that sets of branches may be combined to form the five words. For example, the set of branches comprising branches 58, 60 and 62 combine to form the 3-bit word 000. Similarly the branches 66, 68 and 70 form the 3-bit word 100 and branches 66, 74, and 76 form the 3-bit word 111. In the binary tree representation, the content of the five 3-bit words of FIG. 4 is 10 bits rather than 15.

The preorder traversal in itself is insufficient to reconstruct the binary tree representing the collection of words. To make the preorder traversal uniquely decodable, some additional information about the boundaries between the words must be added. For example, the branch nodes 78 through 84 of the binary may be indicated by an X state which is indicative of the junction between a "0" branch and a "1" branch. The number of branch nodes having an X state is less than the total number of branches. In general, the number of branch nodes indicative of the X state is m-1 where m is the total number of words.

The fundamental operation of the CITO Channel Interface 38 is based on the overlapped transmission of the individual data bits by all of the CITO Interfaces 38. Three possible states exist with the overlapped transmission. These are as follows:

"0" all CITO Channel Interfaces are transmitting a 0-bit.

"1" all CITO Channel Interfaces are transmitting a 1-bit.

"X" at least one CITO Channel Interface is transmitting a 0-bit and at least one is transmitting a 1-bit.

The Decoder 18 does not actually need to distinguish all three states. It can distinguish the "0" state from the "1" state and can interpret a "0" state as a possible "X" state. Each CITO Interface, however, internally is capable of recognizing the occurence of an "X" state. This is due to the fact that it knows whether it transmitted a "0" or a "1" and can recognize its own discord with the current state of the External CITO Channel 34. Therefore, the transmission process can be organized using only two states, i.e., "0's" and "1's".

This is implemented in the CITO protocol by representing as a certain impulse (either a positive or negative impulse) the transmission of a 0-bit and representing a null (0) level signal for the transmission of a 1-bit as illustrated in FIG. 6. With this representation the channel states "0" and "X" appear as a finite level signal and the channel state "1" appears as a null.

Referring back to FIG. 3, the operation of each CITO-WRAP Sub-Module 32 begins with the loading of the first data bit into the Data Bit Register 50 using a CITO protocal. Each Data Register 42 simultaneously attempts to transmit its highest order bit on the Internal CITO Channel which loads the lowest bit value into the Data Bit Register 50. In the given example the Internal CITO Channel 48 loads the 0-bits of words 4 and 5 of the word collection shown in FIG. 4 into the Data Bit Register 50. If the word collection did not have any 0's, the Internal CITO Channel would have loaded a 1-bit into the Data Bit Register 50. The Internal CITO Channel 48 will also suspend any further attempts to select bits from any of the data registers whose highest order bit had a value different from the bit value transmitted to the Data bit Register 50. In the given example the Internal CITO Channel 48 would suspend the selection of bits from the data registers storing the 3-bit words 100, 101, and 111 unitl after the first word has been completely sent.

After receiving their first data bit, the CITO Interfaces 38 of all the CITO-WRAP Sub-Module 32 will attempt to simultaneously transmit their received data bit on the External CITO Channel 34. As previously described, the CITO Interfaces storing a 0-bit in their Data Bit Register 50 will transmit a certain impulse signal on the External CITO Channel 34 while those storing a 1-bit will transmit a null signal. Since the null signal has no effect on the state or status of the External CITO Channel 40, the status of the External CITO Channel 34 will be the impulse signal indicative of a 0-bit. The Channel Status Register 54 connected to the External CITO Channel 34 will store the state of the transmitted data bit and the associated Word Boundary Register 52 will be decremented by one signifying the transmission of a data bit. The state of the External CITO Channel 34 stored in Channel Status Register 54 is then compared with the state of the bit transmitted from its own Data Bit Register 50. If they are the same, the bit position registers associated with the data registers whose highest order data bit was selected by the Internal CITO Channel 48 are decremented by one to signify that the selected data bit was successfully transmitted. If the state of the Channel Status Register 54 is different from the state of Data Bit Register 50, the data bit registers associated with the data registers from which the data bit was selected are not decremented signifying that the data bit in Data Bit Register 50 was not transmitted and the associated CITO-WRAP Sub-Module 22 is suspended from attempting to transmit any further data bits on External CITO Channel 34 until a complete data segment is transmitted.

The Word Boundary Register 52 however continues to be decremented for each data bit transmitted on the External CITO Channel until it is decremented to 0 indicating that a complete data segment and its associated tag and frame number have been transmitted.

When the data bit in the Data Bit Register 50 is successfully transmitted by the CITO Interface 32 the next highest order bits from the selected data registers are shifted into the Internal CITO Channel 48 and the associated Internal CITO Channel again selects the lowest value bit of the received bits and loads this bit value into the Data Bit Register 50. Those selected data registers whose next highest order bit differs from the selected bit are also suspended from further bit selection as previously described. The CITO Interface 38 again attempts to transmit the selected data bit as previously described. The Channel Status Register 54 continues to detect and store the state of the External CITO Channel and the associated Word Boundary Register 52 is decremented. The state of the Channel Status Register 54 is again compared with the state of the bit stored in the Data Bit Register 50. If they are the same, the bit position register associated with the data register from which the data bit was selected is decremented a second time. By this process each bit position register stores a number indicative of the number of bits in its associated data register remaining to be sent.

This procedure continues in each CITO-WRAP Sub-Module until either its associated CITO Interface is suspended from participation by trying to transmit a data bit having a state different from the state of the External CITO Channel 34 or it is still transmitting, when associated Word Boundary Register 52 is decremented to zero signifying it has transmitted a complete data segment (word) including the identification number stored in the Segment Tag Register 44 associated with its unsuspended data register and the frame number stored in the Frame Number Register 56. The CITO protocol is such that identical data segments in each CITO-WRAP Sub-Module 32 will be simultaneously transmitted along with the identical data segments in each of the other CITO-WRAP Sub-Modules.

The decrementation of the Word Boundary Register 52 to 0 initiates a "bit competition" subroutine to determine the transmission of the next data segment. In the "bit competition" subroutine, the Internal CITO Channel 48 in each of the CITO-WRAP sub-Modules 32-1 through 32-N responds to the highest order bit in each of its own bit position registers in Bit Position Register 46 and loads into the Data Bit Register 50 highest order bit position bit having the lowest bit value. This procedure is the same as previously described with reference to selecting the data bits from Data Registers 42. In a like manner when the value of the tested bit position bit associated with a particular data register is different from the selected bit, selection of bit position bits from that particular bit position register is suspended from further participation in the "bit competition". All of the CITO Interfaces now attempt to transmit their selected bit position bit stored in Data Bit Registers 50. The Channel Status Register 54 continues to monitor the state of the External CITO Channel 34. However instead of decrementing Word Boundary Register 52, the state of the External CITO Channel 34 is entered into the Word Boundary Register 52. The state of the CITO Channel is then compared with the state of the bit stored in the Data Bit Register 50. If they are different, transmission by the CITO-WRAP Sub-Module is suspended signifying that none of the bit position registers in its Bit position Register 46 have the next smallest number. If the state of the External CITO Channel 34 is the same as the state of the bit position bit stored in Data Bit Register 50, the Internal CITO Channel 48 responds to the next highest order bits in the unsuspended bit position registers and again loads the bit position bit having the lowest value into Data Bit Register 50. Again the CITO Interface will attempt to transmit this bit position bit along with all of the other unsuspended CITO Interfaces with the state of the External CITO Channel being recorded in the Word Boundary Register 52. If the state of the External CITO Channel and the second highest order bit position bit are different, the transmission of the associated CITO-WRAP Sub-Module 32 will be suspended as described before. If they are the same the process will continue until either the operation of the CITO-WRAP Sub-Module 32 is suspended from bit competition or all of the bit position bits have been transmitted. At the end of the "bit competition" the Word Boundary Registers 52 in each of the CITO-WRAP sub-Modules 32 will store a number indicative of the next smallest segment remaining to be transmitted in any of the CITO-WRAP Modules 32. It is recognized that this next smallest value word may be stored in more than one data register in any given CITO-WRAP Sub-Module 32 and/or may be stored in the data registers of more than one CITO-WRAP Sub-Module.

At the end of the "bit competition" procedure, the content of the Word Boundary Register 52 in each CITO-WRAP Sub-Module is compared with the individual bit position registers to select for tranmission those data registers whose bit position register has the same value as the value stored in its Word Boundary Register 52. Each internal CITO Channel 48 will then begin to load the lowest value data bits of its selected data register or data registers into the associated Data Bit Register 50 one at a time. All of the unsuspended CITO-WRAP Sub-Modules will then start to transmit the data bits of their selected data registers over the External CITO Channel 34 using the CITO protocol described above while the Channel Status Registers 54 in all of the Channel Interfaces decrement their associated Word Boundary Registers 52 each time a bit is transmitted. Because the "bit competition" subroutine has identified the next smallest data segment remaining to be transmitted, the transmission of the bits on the External CITO Channel will be uninterrupted and end when the Word Boundary Register is again decremented to 0, signifying that the transmission of the next smallest data segment has been completed.

After a "bit competition," the CITO-WRAP Sub-Module 32 does not have to send all of the bits in the newly selected data register because the Decoder 18 already knows the value of the higher order bits from the previously transmitted data segment and it also knows from the "bit competition" the number of lower order bits that are different from the previously transmitted data segment. The Decoder 18 also knows that the first bit to be transmitted is a 1-bit which it was attempting to transmit when the selected data register or registers were unselected. Therefore the CITO-WRAP Sub-Module does not transmit this 1-bit but rather selects the bit to be transmitted from the next most significant bit position in the selected data registers This interleaved process of transmitting data and "bit position bits" is repeated until all of the data in each CITO-WRAP Sub-Module of a given Data Compression Unit 12 or 14 (the data bucket) is transmitted.

Figure 7:
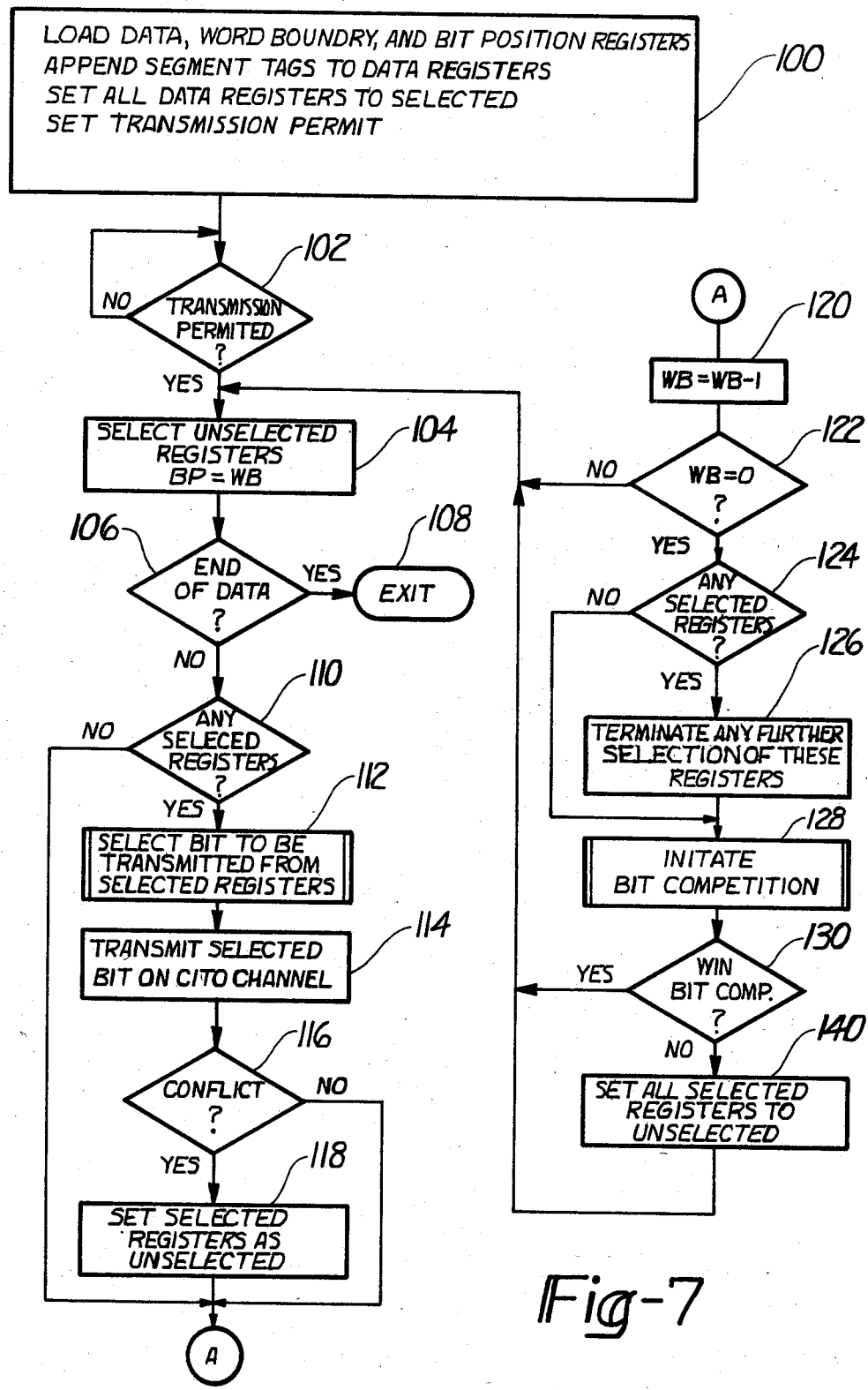
FIG. 7 is a flow diagram of the Executive Program for the CITO-WRAP Sub-Module.
Figure 8:
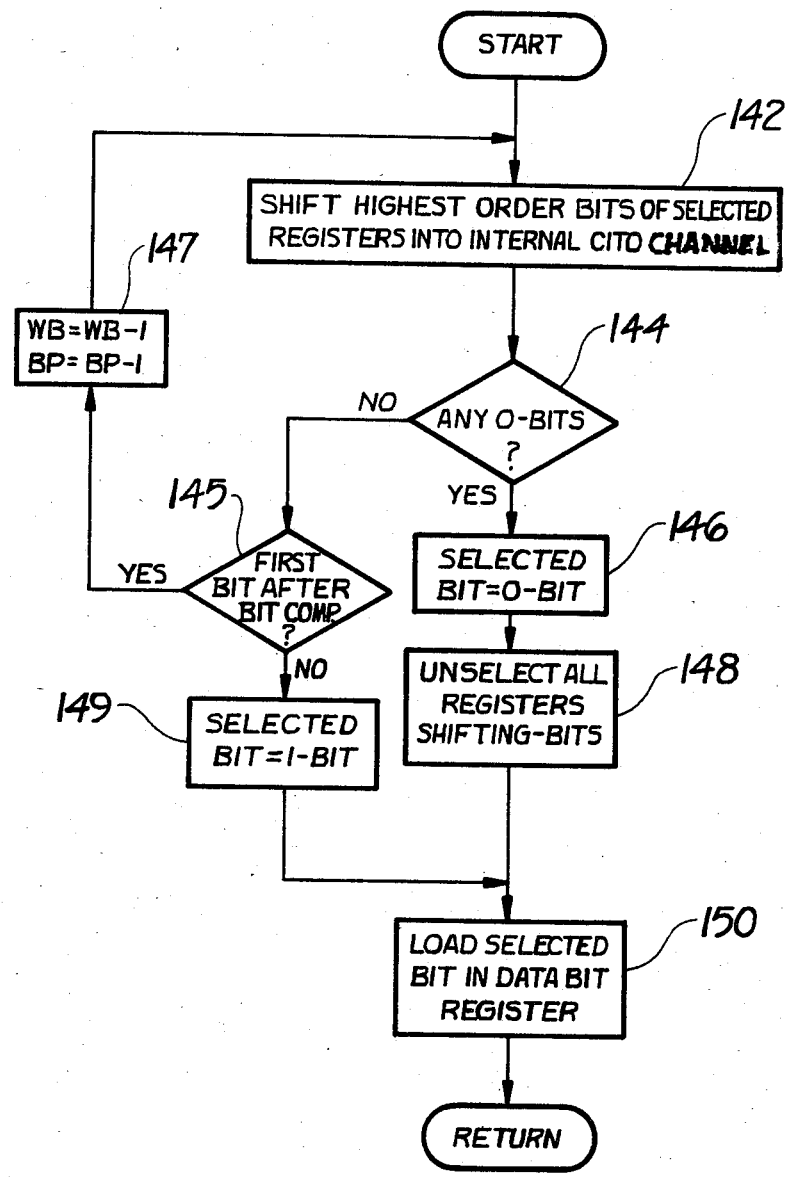
FIG. 8 is a flow diagram of the subroutine for selecting the bit to be transmitted.
Figure 9:
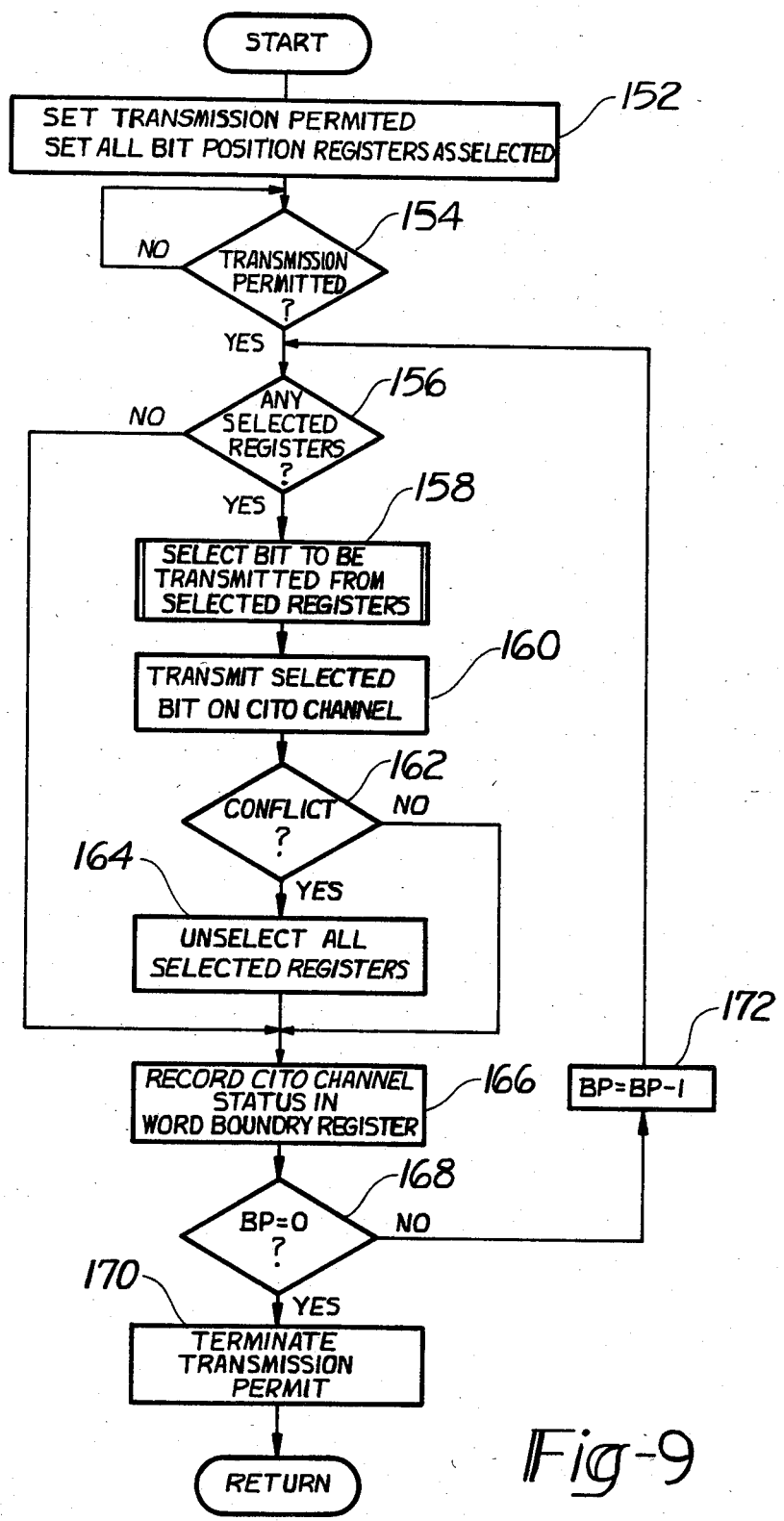
FIG. 9 is a flow diagram of the bit competition subroutine.

A more detailed operation of the on-the-fly data compression system will now be explained with reference to the flow diagrams shown on FIGS. 7, 8 and 9. FIG. 7 is the flow diagram of the Executive Program executed by the Internal CITO Channel in each CITO-WRAP Sub-Module. FIGS. 8 and 9 are the subroutines for selecting the bit to be transmitted and for the "bit competition" respectively.

Referring now to FIG. 7, the Executive Program begins with the initialization of the CITO-WRAP Sub-Module 32 as indicated by block 100. The initialization begins with the loading of the individual data registers of Data Registers 42 with segments of data from the Data Source 10. A number corresponding to the number of data bits in each data segment plus the number of line tag and frame number bits is also loaded into the Word Boundary Register 52 and the individual bit position registers of Bit Position Registers 46. As previously described, each data register has an associated bit position register. The segment identification tags which uniquely identify each data segment are loaded into the Tag Registers 44, all the data registers are set as "selected" and a "transmission permit" flag is set.

After determining that the "transmission permit" flag is set, as indicated by decision block 102, the program compares the content of the individual bit position registers with the content of the Word Boundary Register 52 and identifies as selected all unselected data registers whose bit position registers (B.P.) are storing the same number that is currently stored in the Word Boundary (W.B.) Register 52 as indicated by block 104. The Executive Program then inquires if all the data has been transmitted as indicated by decision block 106. This is indicated by all "1's" in the preceding "bit position" competition. Decision block 110 then inquires if there are any selected data registers having data to be sent. If there is at least one selected register, the Executive Program calls up the subroutine to select the data bit to be sent as indicated by block 112. However if there are no selected registers, the program jumps to block 120 effectively suspending the transmission of data bits by the CITO-WRAP Sub-Module 32.

The subroutine flow diagram for selecting the data bit to be transmitted is illustrated on FIG. 8. In this subroutine, the highest order data bit of all the selected data registers is shifted onto the Internal CITO Channel 48 as indicated by block 142. The Internal CITO Channel 48 then responds to all of the shifted bits to determine if there is at least one 0-bit among the received bits. If there is, then the 0-bit is the bit selected to be transmitted as indicated by block 146 and all of the data registers which shifted a 1-bit into the Internal CITO Channel are set as unselected as indicated by block 148. Otherwise if there are no 0-bits among the bits shifted into the Internal CITO Channel, the selected bit for transmission is a 1-bit. The subroutine then inquires if this 1-bit is the first bit to be transmitted after a bit competition as indicated by block 145. If it is, the Decoder 18 already knows this, therefore it doesn't have to be transmitted. The subroutine will then decrement the word Boundary Register 52 and all bit position registers associated with selected registers as indicated by block 147 then returns to block 142 and shifts the next highest bit from the selected registers onto the Internal CITO Channel 48 for the selection of the next bit to be transmitted. If the 1-bit is not the first bit to be selected after bit competition, then the selected bit is a 1-bit as indicated by block 149. The selected bit is loaded into the Data Bit Register 50 as indicated by block 150 and the processing is returned to the executive program illustrated on FIG. 7.

Returning to FIG. 7, the selected data bit stored in Data Bit Register 50 is transmitted on the External CITO Channel 34 as indicated by block 114. With the Channel Status Register 54 storing the state of the External CITO Channel during transmission as previously described. The Internal CITO Interface then compares the state of the selected bit in Data Bit Register 50 with the state of the External CITO Channel 34 stored in Channel Status Register 54 to determine if they are the same as indicated by decision block 116. If there is a conflict or difference, the selected data registers are set as unselected as indicated by block 118 and the Word Boundary Register 52 is decremented as indicated by block 120. If the state of the Data Bit Register 50 and the Channel Status Register 54 are the same, the procedure proceeds to block 120 and the Word Boundary Register is decremented.

Decision block 122 tests the content of the Word Boundary (WB) Register 52 to determine if a complete data segment has been transmitted, i.e., the content of the Word Boundary Register (WB) being 0. If the content of the Word Boundary Register 52 is not 0, the Executive Program returns to block 104 and the intervening steps are repeated until the Word Boundary Register is decremented to zero.

When there are no selected data registers in the particular CITO-WRAP Sub-Module 32, the program jumps to block 128 and initiates the "bit competition" subroutine shown on FIG. 9. Referring now to FIG. 9, the "bit competition" subroutine begins with setting all of the bit position (BP) registers as selected and sets the "transmission permitted" flag as indicated by block 152. The decision block 154 continuously checks to determine if transmission is permitted. If it is, decision block 156 checks to determine if there are any "selected" bit position registers. If there is at least one selected bit position register, the Internal CITO Channel proceeds to select the bit to be transmitted as indicated by block 158. The bit selection subroutine 158 is similar to the bit selection subroutine 112 shown on FIG. 8 in which the bit having the lowest bit value is loaded into the Data Bit Register 50. The selected bit is then transmitted on the External CITO Channel 34 as indicated by block 160 and the state of the External CITO Channel 34 is stored by the Channel Status Register 54. Decision block 162 then compares the state of the transmitted bit stored in the Data Bit Register 50 with the state of the Channel Status Register 54 to determine if the selected bit currently stored in the Data Bit Register 50 was actually transmitted. If there is a conflict between the state of the bits in the Data Bit Register 50 and the Channel Status Register 54, all of the bit position registers are set to "unselected" as indicated by block 164 and the value of the bit stored in the Channel Status Register 54 is recorded in the Word Boundary Register 52 as indicated in block 166. Otherwise the subroutine jumps immediately to record the content of the Channel Status Register 54 in the word Boundary Register 52 as shown. Decision block 168 then inquires if the least significant bit of the bit position registers was transmitted. If it was, i.e., BP=0, the "transmission permit" is terminated as indicated by block 170 and the process returns to the executive program shown on FIG. 7. However if the transmitted bit was not the least significant bit, the bit selection pointer is indexed, to transmit the next lower most significant bit as indicated by block 172. This subroutine continues until all of the bit position data has been analyzed. At the end of the "bit competition" the Word Boundary Register 52 stores a number indicative of the next smallest data segment in any data register in a given Data Compression Unit 12 or 14.

Referring back to FIG. 7, after the bit competition, decision block 130 inquires within each CITO-WRAP Sub-Module 32 if it has won the "bit competition". This may be determined by either the CITO-WRAP Sub-Module having a "selected" bit position register at the end of the "bit competition" or by any bit position register in the CITO-WRAP Sub-Module storing a value equal to the content of the Word Boundary Register 52. If the given CITO-WRAP Sub-Module is the winner or among the winners of the "bit competition" subroutine, the Executive Program returns to block 104 and proceeds to select for transmission any data register whose bit position register is storing the same number stored in the Word Boundary Register 52 afte the "bit competition". If the CITO-WRAP Sub-Module loses the "bit competition" all of the data registers in that Sub-Module are set as "unselected" as indicated by block 140 and the executive program returns to block 104. This procedure will be repeated until all of the data from all of the data registers in each Data Compression Module is transmitted as previously indicated by Decision block 106. When all of the data has been transmitted the executive program ends.

Figure 10:
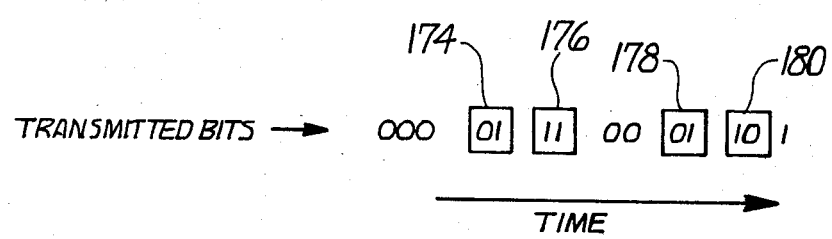
FIG. 10 illustrates the format of an interleaved transmission of the data and bit position bits.

The data transmitted on the External CITO Channel 34 comprises the interleaving of data and bit competition bits. As an example, the transmission of the five 3-bit words shown on FIG. 4 are illustrated in FIG. 10. In this example, it is immaterial if the five words are initially stored in five different CITO-WRAP Sub-Modules or if they are all stored in one CITO-WRAP Sub-Module or if they are distributed between two or more CITO-WRAP Sub-Modules. The bit competition bits are enclosed in boxes 174, 176, 178 and 180 to distinguish them from the data bits. Referring to FIG. 10, the first three 0's represent the segment 000 which was transmitted first. The 01 in box 174 represents value the bit competition following the transmission of first segment. As previously discussed, this bit competition was won by the segment 001 in which the last bit was a 1. Therefore there was only one bit left to transmit which was a 1-bit which was not transmitted. The next "bit competition" box 176 contains the digital representation of 3 bits. This bit competition is now won by the CITO-WRAP Sub-Modules storing segments 100, 101 and 111. Since the highest order bit is a 1, it is not transmitted and only the two 0-bits of the word 100 were selected and transmitted. The next bit competition, signified by block 178, was won by the word 101 which only had a one bit left to send. Again, this is a 1-bit, therefore it was not sent. The final bit competition was won by the word 111 which still had two bits left to send. The first bit being a 1-bit is not transmitted; therefore only the final 1-bit had to be sent to complete the transmission.

Figure 11:
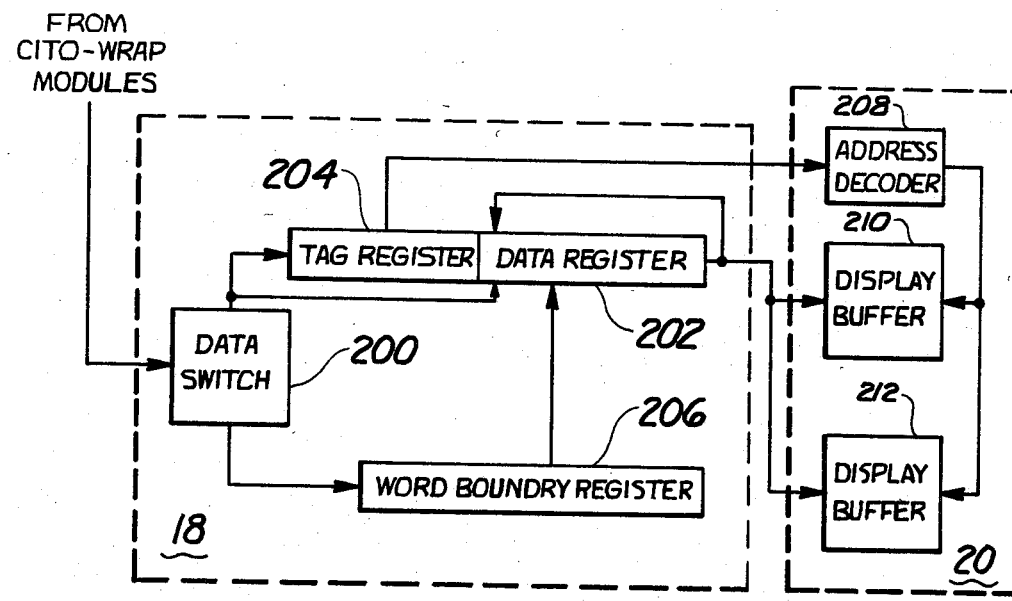
FIG. 11 is a block diagram of the Decoder.

The structural details of the Decoder 18 and Buffer 20 are shown on FIG. 11. The Decoder 18 has a Data Switch 20 receiving the data transmitted from the Data Compression Modules 12 and 14. In a hard wired system the Data Switch 20 may be connected directly to the External CITO Channel 34. Alternatively when the data is transmitted over a radio communication link such as Transmission Link 24 the Decoder would be preceded by a receiver circuit (not shown) which would demodulate the received radio signal and reproduce the signal on a data channel equivalent to External CITO Channel 34. Receiver circuits of this type are well known in the art and need not be shown for an understanding of the data compression system.

The Data Switch 200 transmits the data and tag information to a Data Register 202 and Tag Register 204 and transmits the bit competition data to a Word Boundary Register 206 corresponding to the Word Boundary Register 52 in the CITO-WRAP Sub-Modules 32. The tag information which includes both the data segment tag and frame number are transmitted to an Address Decoder 208 in the Display Buffer 20, while the segment data is transmitted to the inputs of a pair of Display Buffer Storage Units 210 and 212 one for each of the two Data Compression Modules 12 and 14. Each Display Buffer Storage unit 210 and 212 comprises a plurality of random access memories, one for each of the CITO-WRAP Sub-Modules 32 in each of the two Data Compression Modules 12 and 14. Each of the random access memories has a storage capacity equal to the storage capacity of the Data Register 42 such that each data frame can be stored separately. The address output from the Address Decoder 208 in response to the tag and frame information identifies the random access memory and the location in that memory where the segment data received from Data Register 202 is to be stored.

The Word Boundary Register 206 stores the results of the "bit competition" and determines how many data bits will be received during the next data transmission to complete the next data segment as shall be explained hereinafter.

To properly decode the transmitted compressed data it is necessary to synchronize the operation of the Decoder 18 with the Data Compression Module transmitting the data. This synchronization is necessary in order for the Decoder 18 to distinguish the segment data from the bit competition data. The synchronization signal is coventionally a unique data pattern which cannot occur during the transmission of a "data bucket". One data pattern which may be used is a series of log (n)+1 bits of silence (i.e., 1-bits) followed by an inpulse indicative of a 0-bit appearing on the External CITO Channel 34 at the end of the "data bucket", however any other unique bit pattern may be used. In a hard wired system, synchronization may be achieved by a separate communication link, from External CITO Channel as is known in the art.

Figure 12:
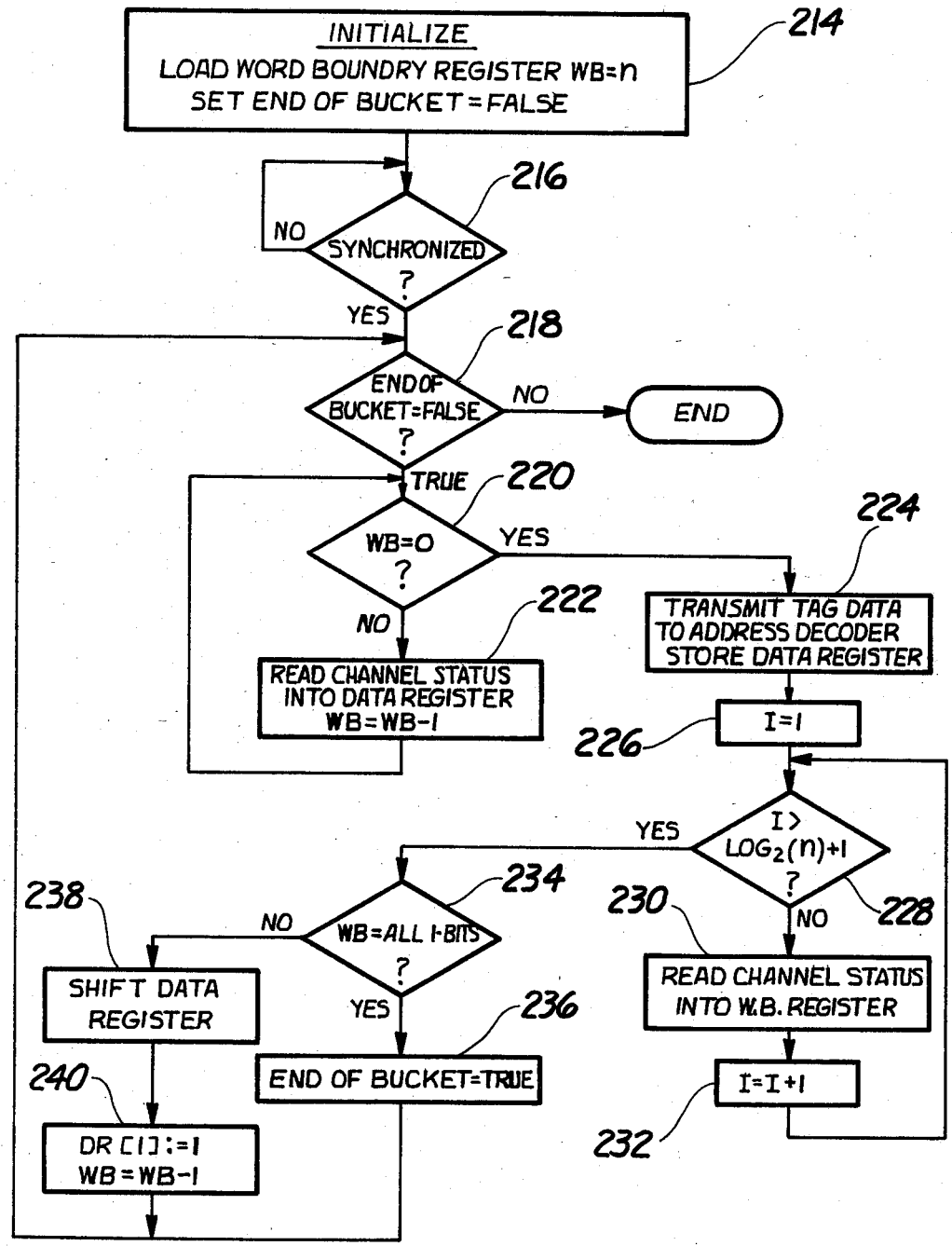
FIG. 12 is a flow diagram for the Decoder.

The operation of the Decoder 18 will now be explained with reference to FIG. 11 and the flow diagram shown on FIG. 12. The operation begins by loading the Word Boundary Register 206 with a number equal to the number of bits in each data segment and setting the End of Bucket flag to false as shown in block 214. The Decoder 18 then waits for the synchronization signal as indicated by decision block 216. After synchronization is achieved, decision block 218 inquires if the "end of the bucket" has been reached. If the End of bucket flag is true, all of the data segments from the given Data Compression Unit 12 or 14 have been received and the decoding process ends until it receives another synchronization signal as indicated.

If the End of Bucket flag is false, decision block 220 inquires if the content of the Word Boundary Register 206 is zero (WB=0). When the content of the Word Boundary Register 204 is not zero, the Data Switch 200 directs the bit value appearing on the External CITO Channel 34 to the Data Register 202 then decrements the Word Boundary Register 206. This process is repeated until the Word Boundary Register is decremented to zero. The Tag data stored in the Tag Register 204 is transmitted to the Address Decoder 208 which generates an address identifying the particular Display Buffer 210 or 212 and the location in that Buffer where the segment data shifted into Data Register 202 is to be stored. The segment data is then stored in the Display Buffer at the location identified by the address generated by the Address Decoder 208. Data Register 202, however, retains the stored segment data for reconstruction of the next segment data. The Decoder 18 then monitors the "bit competition" performed by the Data Compression Unit 12 or 14 by first setting the pointer to the Word Boundary Register 206 to 1 as indicated by block 226. Decision block 228 then inquires if the "bit competition" is completed, i.e., $I = \log_2(n) + 1$. If the bit competition is still going on, the Data Switch 200 continues to shift the "bit competition" bits into the Word Boundary Register 206 as indicated by block 230 then increments the pointer to the next position. This continues until the "bit competition" is completed. Upon completion of the "bit competition" decision block 234 then inquires if the content of the Word Boundary Register 206 is all 1-bits signifying that the data bucket is terminated.

When all the bits in the Word Boundary Register are 1-bits, the End of Bucket flag is set to "true" as indicated by block 236 and the CITO Decoder 18 exits the decoding routine via decision block 218. Otherwise the content of the Data Register 202 are shifted to discard a number of lower order bits equal to the number stored in the Word Boundary Register 206. This preserves the higher order bits of the preceding data segments which currently reside in the Data Register 202 and removes only those data bits following the last conflict encountered during the data transmission by the Data Compression Modules 12 or 14. As previously indicated the Data Compression Modules 12 or 14 do not transmit the 1-bit of the next smallest segment since it had to be a 1-bit. Therefore the Decoder 18 automatically inserts a 1-bit into the first or lowest order bit position of the Data Register 202 as indicated by block 240 causing the remaining bits to be shifted 1 bit towards the next higher order and the Word Boundary Register 206 is then decremented by 1. At the end of this procedure, the Word Boundary Register stores a number equal to the number of segment data bits which will be transmitted during the next data transmission.

This procedure is repeated with the Decoder 18 storing the transmitted data in the Data Register 202 and storing the results of the subsequent "bit competition" in the Word Boundary Register 206 until all of the transmitted data within a given "data bucket" is decoded and stored in Display Buffer 20.

It is not intended that the invention be limited to the hardware arrangement or operational procedures disclosed herein. It is believed that those skilled in the art may use different coding techniques or modify the procedures set forth in the flow diagrams without departing from the spirit of the invention as described herein and set forth in the appended claims.

We claim:

1. A data compression system having a communication channel interposed between a data source and an ultimate utilization device characterized by;
    at least one data compression module for transmitting on the communication channel the data received from the data source in a compressed format comprising an interleaved transmission of data bits and bit position bits, said bit position bits indicative of the number of data bits to be transmitted in the subsequent data bit transmission which are different from the preceding data bit transmission; and
    data decoder means responsive to the data bits and bit position bits transmitted on the communication channel for reconstructing the data to its original format as generated by the data source; and
    wherein said at least one data compression module comprises a plurality of sub-modules, each sub-module comprising:
    data storage means for temporarily storing the data received from the data source in a plurality of data registers, each data register storing a predetermined segment of the received data;
    a plurality of bit position registers, one associated with each data register, for storing bit position bits indicative of the number of data bits in its associated data register remaining to be transmitted;
    a word boundary register connected to the communication channel for storing a number corresponding to the smallest number of data bits in any data register in any sub-module remaining to be transmitted;
    means for repeatedly selecting data bits to be transmitted from said plurality of data registers;
    means for transmitting said selected data bits on said communication channel one at a time simultaneously with the transmission of a selected data bit by the other sub-modules using a content induced transmission overlap protocol until all of the bits from at least one data register in any sub-module is completely transmitted;
    bit competition means responsive to each time all the data bits from any data register in any sub-module are completely transmitted for transmitting said bit position bits on said communication channel simultaneously with the other sub-modules using a content induced transmission overlap protocol to generate a number corresponding to the smallest number of data bits remaining in any data register in any sub-module; and
    means for recording said number corresponding to the smallest number of data bits in said word boundary register.

2. the data compression system of claim 1 wherein said means for selecting bits to be transmitted comprises:

means for comparing the number stored in each bit position register with the number stored in the word boundary register at the end of transmitting said bit-position bits to identified as a selected data register each data register whose associated bit position register is storing the same number as said word boundary register;

data bit selection means for transmitting to said means for transmitting the highest order data bit in said selected data registers having the lowest value as the selected data bit; and means for identifying as unselected each selected data register whose highest order data bit has a value different from the value of the selected data bit.

3. The data compression system of claim 2 wherein said data bit selecting means includes:

means for discarding as the selected data bit, the first selected data bit having a bit value of 1 immediately following a bit position bit transmission causing a new selected data bit to be selected from the next highest order data bits; and means for decrementing said word boundary register in response to discarding said selected bit having a bit value of 1.

4. The data compression system of claim 3 wherein said means for transmitting said selected data bits comprises;

a data bit register connected to said communication channel for storing said selected data bit;

data transmission means for transmitting said selected data bit on said communication channel, said means transmitting a selected data bit having a bit value of "1" as a null signal, and a selected data bit having a bit value of "0" as a predetermined impulse;

means responsive to the transmission of a selected data bit on the communication channel for decrementing the content of said word boundary register;

a channel status register connected to said communication channel for storing the bit value of the transmitted data bit;

means for decrementing the content of each bit position register associated with a selected data register in response to the bit value stored in said channel status register being the same as the bit value of the data bit register transmitted to said means for transmitting; and means for unselecting each selected data register in response to the bit value of said channel status register being different from the selected bit transmitted to said means for transmitting.

5. The data compression system of claim 4 wherein said bit competition means comprises:

bit position selection means responsive to the word boundary register being decremented to zero for selecting bit positions in each of said bit position registers in a sequential order starting with the highest order bit position;

bit position bit selection means for loading into said data bit register the bit position bit from the selected bit position in each bit position register having the lowest bit value; means for loading the bit value of the selected bit position bit into said data bit register;

means for transmitting on the communication channel the bit value of the selected bit position bit loaded into said data register simultaneously with the transmission of the bit value of the bit position bits selected by the other sub-modules using said content induced transaction overlap protocol;

means responsive to the transmission of each bit position bit on said communication channel for decrementing said bit position selection means to identify the next lower bit position in each bit position register;

means for repeatedly recording the bit value of said channel status register in said word boundary register after the transmission of each selected bit position bit to record in said word boundary register said number indicative of the smallest number of bits remaining to be transmitted in any data register in any sub-module; and means for detecting the transmission of the bit from the least significant bit position of said bit position registers to terminate the selection and transmission of bit position bits and initiate the selection and transmission of data bits.

6. The data compression system of claim 4 wherein each sub-module has a tag register associated with each of said data registers, said tag register storing a tag number uniquely identifying its associated data register and a frame register storing a frame number uniquely identifying each sub-module, said means for transmitting includes means for transmitting on the communication channel the tag number and the frame number associated with each data register in said sub-module which has just completed the transmission of all its data bits and wherein said word boundary register stores a number corresponding to the number of data bits plus the number of bits in said tag and frame registers.

7. The data compression system of claim 6 wherein said data decoder comprises.

a decoder data register for storing the transmitted data bits;

a decoder tag memory for storing the transmitted tag and frame numbers associated with the stored data bits;

a decoder word boundary register for storing the bit position bits transmitted in the interleaved data bit and bit position bit transmission, said decoder word boundary register initially storing a number equal to the number of data bits stored in each data register plus the number of bits in the tag and frame registers;

means for decrementing the content of said decoder word boundary register in response to storing each transmitted data, tag, and frame bit;

switch means receiving said transmitted interleaved data bit and bit position bit for directing said data bits to said decoder data register and said tag and frame bits to said tag register until said decoder word boundary is decremented to zero, and directing said bit position bits to said decoder word boundary register;

buffer means for storing decoded data bits;

address generator means responsive to the tag and frame numbers stored in said decoder tag register for generating a data address uniquely identifying the location in said buffer means where the data bits in the data shift register are to be stored;

means for transmitting the values of the data bits stored in the decoder shift register to the location in the buffer means identified by said generated data address in response to said decoder word boundary register being decremented to zero; and means responsive to the end of the bit position bit transmission for removing from the contents of the decoder data register a number of least significant bits equal to the number stored in the word boundary register to remove from said decoder data register a number of bits equal to the number of data bits to be received in the next data bit transmission.

8. The data compression system of claim 7 wherein said decoder data register is a shift register and wherein said means for removing shifts the content of said shift register a number of spaces equal to the number stored in said decoder word boundary register.

9. The data compression system of claim 8 wherein said means for removing includes means for inserting a 1-bit into the least significant bit position of said shift register after shifting the contents of said shift register to include in the content of the shift register a non-transmitted 1-bit.

10. The data compresion system of claim 7 wherein said buffer means comprises a plurality of individual buffers, each of said individual buffers storing the data transmitted from a corresponding sub-module, and wherein said address generator means generates an address identifying the individual buffer and the location within that buffer where the data from the decoder data register is to be stored.

11. A method for compressing data received from a data source comprising the steps of:
storing in at least one data compression module the data generated by the data source, each data compression module having a plurality of sub-modules, each sub-module storing a portion of the generated data in a predetermined sequence, and each sub-module having a plurality of data registers storing a predetermined segment of said stored portion of generated data;
storing in plurality of bit position registers, one associated with each data register, a number corresponding to the number of data bits in its associated data register remaining to be transmitted;
storing in a plurality of word boundary registers, at least one associated with each sub-module, a number corresponding to the number of data bits stored in the data register having the smallest number of data bits in any of the data registers in any sub-module remaining to be transmitted;
repeatedly selecting in each sub-module a selected data bit from among the highest order data bits stored in its plurality of data registers;
simultaneously transmitting said selected data bits on a common communication channel by each of said sub-modules using a content induced transaction overlap protocol until all the data bits in any one data register in any sub-module are completely transmitted;
decrementing the content of each bit position register each time a data bit from its associated register is transmitted;
decrementing the content of each word boundary register each time a selected data bit is transmitted;
simultaneously transmitting by all of said sub-modules the bit position bit content of their bit position registers on said communication channel, one bit position at a time using a content induced transaction overlap protocol to generate a number corresponding to the smallest number of data bits remaining to be transmitted in any data register in any sub-module;
recording said transmitted bit position bits in said word boundary register to generate a number in said word boundary register equal to the smallest number of data bits in any data register remaining to be transmitted; and
repeating said steps from said step of repeatedly selecting a selected data bit to the last step until all the data bits in every data register are transmitted.

12. The method of claim 11 wherein said step of repeatedly selecting selected data bits comprises the steps of:
comparing the number stored in each bit position register with the number stored in the word boundary register to identify as a selected data register each data register whose associated bit position register is storing the same number as the number stored in the word boundary register;
selecting from among the highest order data bits in the selected data registers the data bit having the lowest bit value as the selected data bit; and
identifying as an unselected data register each selected data register whose highest order data bit was different from the selected data bit.

13. The method of claim 12 wherein said step of repeatedly selecting data bits further includes the step of:
discarding as said selected data bit, the first selected data bit having a bit value of 1 immediately following a transmission of bit position bits; and
means for decrementing said bit position register and word boundary register in response to discarding the data bit having a bit value of 1.

14. The method of claim 13 wherein said means of simultaneously transmitting said selected data bits comprises the steps of:
temporarily storing the selected data bit in a data bit register;
transmitting on the communication channel the data bit stored in the data bit bit register having a bit value of 1 as a null and a data bit having a bit value of 0 as a certain impulse; and
storing the bit value transmitted on said communication channel in a channel status register.

15. The method of claim 14 wherein said step of decrementing the content of each bit position register comprises the steps of:
comparing the content of each bit position register with the content of the word boundary register to decrement the number stored in each bit position register associated with a selected data register when the number stored in the bit position register is the same as the number stored in the word boundary register.

16. The method of claim 15 wherein said step of simultaneously transmitting the bit position bit content of the bit position registers comprises the steps of:
selecting from among the plurality of bit position registers in each sub-module, the highest order bit position bit having the lowest bit value as a selected bit position bit;
loading said selected bit position bit in said data bit register;
transmitting on the communication channel the selected bit position bit having a bit value of 1 as a null and a selected bit position bit having a bit value of 0 as a certain impulse;
recording the state of the communication channel in said channel status register in response to the transmission of said selected bit position bit;

transferring the content of said channel status register into said word boundary register;

terminating said step of repeatedly selecting bit position bits in response to the content of said channel status register being different from the content of said data bit register;

indexing said step of selecting from the highest order bit position to select said selected bit from the next highest order bit position of said bit position registers; and repeating said steps until the selected bit is selected from the least significant bit position of said bit position register to record in said word boundary register a number corresponding to the smallest number of bits remaining to be transmitted in any data register in any sub-module.

17. The method of claim 16 wherein each of said sub-modules includes a frame register storing a frame number uniquely identifying its associated sub-module and wherein each sub-module further includes a plurality of tag registers, one for each data register, storing a tag number uniquely identifying each data register, said method further includes the step of transmitting the frame and tag number of their associated sub-module and data register immediately after the associated data register has completed the transmission of all its data bits to uniquely identify the transmitted data segment just transmitted.

18. The method of claim 17 wherein said method further includes the step of decoding said transmitted data and bit position bits to reconstruct the transmitted data to its original format.

19. The method of claim 18 wherein said step of decoding comprises the steps of:

storing said transmitted data bits in a data shift register;

storing said transmitted frame and tag numbers in a tag shift register;

storing in a decoder word boundary register an initial value corresponding to the number of data bits stored in said data registers tag register and frame register;

decrementing said decoder word boundary register in response to storing each data bit in said shift register and said tag and frame bits in said tag shift register;

decoding said frame and tag numbers to generate and address identifying the location in a buffer memory where the content of said shift register is to be stored;

transferring the content of said data shift register to the location in the buffer memory identified by said address;

storing in said decoder word boundary register said transmitted bit position bits to generate a number corresponding to the number of data tag and frame bits to be transmitted during the next data transmission;

shifting the data bit content of said shift register to discard a number of lower order data bits equal in number to the number stored in said decoder word boundary register;

inserting a bit having a bit value of 1 in the lowest order bit position of said shift register after it was shifted and decrementing said word boundary register; and repeating said steps starting with said step of storing said transmitted data bits to the end until all of the transmitted data has been decoded and stored in said buffer memory.

20. The method of claim 11 wherein said method further includes the step of decoding said transmitted data and bit position bits to reconstruct the transmitted data to its original format.

* * * * *